US011875972B2

(12) United States Patent
Driessen (10) Patent No.: US 11,875,972 B2
(45) Date of Patent: Jan. 16, 2024

(54) VOLTAGE WAVEFORM GENERATOR FOR PLASMA PROCESSING APPARATUSES

(71) Applicant: PRODRIVE TECHNOLOGIES INNOVATION SERVICES B.V., Son en Breugel (NL)

(72) Inventor: Antonius Wilhelmus Hendricus Johannes Driessen, Groningen (NL)

(73) Assignee: PRODRIVE TECHNOLOGIES INNOVATION SERVICES B.V., Son en Breugel (NL)

(*) Notice: Subject to any disclaimer, the term of this patent is extended or adjusted under 35 U.S.C. 154(b) by 208 days.

(21) Appl. No.: 17/604,897

(22) PCT Filed: Apr. 21, 2020

(86) PCT No.: PCT/EP2020/061088
§ 371 (c)(1),
(2) Date: Oct. 19, 2021

(87) PCT Pub. No.: WO2020/216741
PCT Pub. Date: Oct. 29, 2020

(65) Prior Publication Data
US 2022/0223377 A1    Jul. 14, 2022

(30) Foreign Application Priority Data
Apr. 24, 2019 (NL) .................................. 2022999

(51) Int. Cl.
*H03K 5/00* (2006.01)
*H01J 37/32* (2006.01)
(Continued)

(52) U.S. Cl.
CPC ...... *H01J 37/32174* (2013.01); *H01J 37/321* (2013.01); *H03K 3/02* (2013.01);
(Continued)

(58) Field of Classification Search
CPC .............. H01J 37/321; H01J 37/32174; H01J 37/32045; H01J 37/32577; H01J 37/32027; H03K 3/02; H03K 5/003; H03K 5/01
See application file for complete search history.

(56) References Cited

U.S. PATENT DOCUMENTS 9,208,992 B2 * 12/2015 Brouk ...................... H01J 37/24
10,607,813 B2 * 3/2020 Fairbairn ............ C23C 16/4586
(Continued)

FOREIGN PATENT DOCUMENTS

EP       0987818 A2    3/2000

OTHER PUBLICATIONS

International Search Report and Written Opinion of the International Searching Authority from the European Receiving Office in PCT/EP2020/061088, dated Jul. 3, 2020, which is an international application corresponding to this U.S. application.

*Primary Examiner* — Tuan T Lam
(74) *Attorney, Agent, or Firm* — Kolitch Romano Dascenzo Gates LLC (57) ABSTRACT

Methods and devices for generating a voltage waveform at an output may include providing four DC voltages of different magnitudes. The first ($V_1$) magnitude is higher than the third ($V_3$) and fourth ($V_4$) magnitude. The fourth DC voltage is coupled to the output followed by coupling the first DC voltage to the output, to bring an output voltage ($V_P$) at the output to a high level. The first DC voltage is decoupled from the output, followed by coupling the third DC voltage to the output, to obtain a drop of the output voltage ($V_P$). A ground potential ($V_0$) is coupled to the output following coupling the third DC voltage and the second DC current ($I_2$) is coupled to the output following
(Continued)

coupling the ground potential, wherein the second DC current ramps down the output voltage ($V_P$).

20 Claims, 9 Drawing Sheets

(51) Int. Cl.
    *H03K 3/02*           (2006.01)
    *H03K 5/003*         (2006.01)
    *H03K 5/01*           (2006.01)

(52) U.S. Cl.
    CPC ........ *H01J 2237/327* (2013.01); *H03K 5/003* (2013.01); *H03K 5/01* (2013.01)

(56) References Cited

U.S. PATENT DOCUMENTS

| | | | |
|---|---|---|---|
| 11,264,209 B2* | 3/2022 | Van Zyl | H01J 37/32183 |
| 11,670,487 B1* | 6/2023 | Nguyen | H01J 37/32174 |
| | | | 307/52 |
| 2012/0081350 A1* | 4/2012 | Sano | H05B 44/00 |
| | | | 345/60 |
| 2012/0228263 A1 | 9/2012 | Ui et al. | |
| 2014/0062303 A1* | 3/2014 | Hoffman | C23C 14/345 |
| | | | 315/111.21 |
| 2018/0032100 A1 | 2/2018 | Kim et al. | |
| 2018/0226225 A1 | 8/2018 | Koh et al. | |
| 2022/0020567 A1* | 1/2022 | Koshimizu | H01J 37/32146 |

* cited by examiner

VOLTAGE WAVEFORM GENERATOR FOR PLASMA PROCESSING APPARATUSES

TECHNICAL FIELD

The present disclosure is related to a voltage waveform generator for a plasma processing apparatus, and to a related method of generating a voltage waveform for use in plasma processing, in particular a voltage waveform for producing a voltage bias on a substrate to be plasma processed.

INTRODUCTION

In plasma assisted etching and plasma assisted layer deposition radio frequency (RF) generators are used to generate a bias voltage for controlling the ion energy. To improve process control, accurate control of the bias voltage and the resulting ion energy distribution (IED) is of importance. Generating this bias voltage is done with limited efficiency (wideband) linear amplifiers or with limited flexibility (narrowband) switch-mode amplifiers or dedicated pulse generating amplifiers. Most amplifiers are only indirectly controlling the output voltage waveform (e.g. controlling output power or relying on calibration), resulting in limited performance (the generated waveform is less close to the desired output voltage waveform), resulting in a less desired ion energy distribution and limited reproducibility (wafer to wafer variation and system to system variation).

U.S. Pat. No. 9,208,992 describes a plasma processing apparatus comprising a switch mode power supply for forming a periodic voltage function at an exposed surface of the substrate to be processed. The periodic voltage function effectuates a desired ion energy intensity distribution to perform etching of the substrate or plasma deposition on the substrate.

The above switch mode power supply can generate a waveform of particular shape with a DC current to compensate for the ion current (see FIG. 14 of U.S. Pat. No. 9,208,992). To do so, the switch mode power supply comprises two switch components that are coupled in a half-bridge and are controlled based on drive signals generated by a controller as shown in FIG. 3; of U.S. Pat. No. 9,208,992. With such a waveform, the reactor capacitance and stray inductance experience commutation resulting in losses. The relation between system parameters and the commutation (or switching) losses P can be expressed as:

$$P_{REACTOR\ COMMUTATION} \propto C_{REACTOR} \cdot V_{COMMUTATION} \cdot f_{COMMUTATION}$$

Typical ranges for the parameters are:
$C_{REACTOR}$: 500 pF to 10 nF,
$V_{COMMUTATION}$: 10 V to 2 kV,
$f_{COMMUTATION}$: 20 kHz to 1 MHz.

Depending on the process conditions and reactor design, this can result in losses over 500 W.

In current plasma processes, there is a tendency towards higher commutation voltage levels, larger reactors sizes, with higher capacitance $C_{REACTOR}$ Using the prior art waveform generator would thus entail even higher losses, which is unacceptable.

In addition, a plasma reactor has an inherent reactor capacitance and the interconnection between reactor and bias voltage generator a stray inductance, which form a LC circuit having an inherent resonance characteristic. Due to the resonance in the system, slow switching speeds (limited dV/dt on the switch node) or a damping resistance (or snubber) are mandatory to prevent excitation of the resonance which would cause undesired ringing of the substrate voltage. This ringing would result in an undesired voltage on the substrate, which has a negative influence on the desired IED. Such slow switching speed results in long discharge time periods effectively reducing the process/discharge ratio, which in turn results in a longer time to process the substrate. A too long discharge time can additionally have a negative influence on the sheath formation or preservation of the sheath. However, a damping resistance (or snubber) would cause additional undesired losses.

SUMMARY

It is an aim of the present disclosure to overcome the above drawbacks. It is an aim of the present disclosure to provide a voltage waveform generator for use in plasma processing and related method of generating a voltage waveform, which allows for obtaining higher efficiency. It is an aim to provide such generator and method allowing for increasing process throughput with no or limited efficiency loss.

It is an aim of the present disclosure to provide plasma processing apparatuses and related methods that allow for an improved process control. In particular, it is an aim to provide such apparatuses and methods that enable to approach the ideal or desired voltage waveform more precisely and/or which allow for faster convergence to such ideal waveform.

According to a first aspect of the present disclosure, there is provided a method of generating a voltage waveform for use in plasma processing. The voltage waveform is advantageously a periodic bias voltage that is applied to an exposed surface of a substrate undergoing plasma processing, such as plasma assisted etching, plasma assisted layer deposition, or Reactive Ion Etching (REI).

According to a second aspect of the present disclosure, there is provided a voltage waveform generator for a plasma processing apparatus. The voltage waveform generator is advantageously configured to generate a periodic bias voltage to be applied to a substrate that is subjected to plasma processing. The voltage waveform generator is advantageously configured to implement the method according to the first aspect.

According to a third aspect of the present disclosure, there is provided a plasma processing apparatus, comprising the voltage waveform generator of the second aspect.

The voltage waveform generator according to the present disclosure comprises a power stage topology allowing generation of a periodic bias voltage, e.g. for use in a plasma processing apparatus. The power stage topology comprises different voltage levels which can consecutively be coupled to the output for obtaining the periodic bias voltage. The number of voltage levels is such that resonant commutation during a change of voltage levels of the waveform can be obtained, resulting in fast and lossless commutation. Furthermore, advantageously, through appropriate control of the timing of the switches that apply the different voltage levels, and through appropriate selection of the voltage levels, it can be obtained that at the end of the commutation (discharge) period, the desired substrate voltage level is reached, which is advantageously substantially equal to the generator output voltage, and the current though the stray inductance of the interconnection between the generator and the substrate is approximately 0 A. As a result, there is no ringing in the system, obviating the need to implement damping or slow commutation. The lossless commutation allows for generating the bias voltage in a highly efficient manner. The fast commutation reduces the disturbance of the sheath during the discharge period. This results in better process control. The fast commutation makes it possible to further narrow down the IED. A narrow IED is critical for process control.

According to another aspect, a method of controlling or operating a plasma processing apparatus is described herein.

BRIEF DESCRIPTION OF THE DRAWINGS

Aspects of the present disclosure will now be described in more detail with reference to the appended drawings, wherein same reference numerals illustrate same features and wherein.

DETAILED DESCRIPTION

Figure 1:
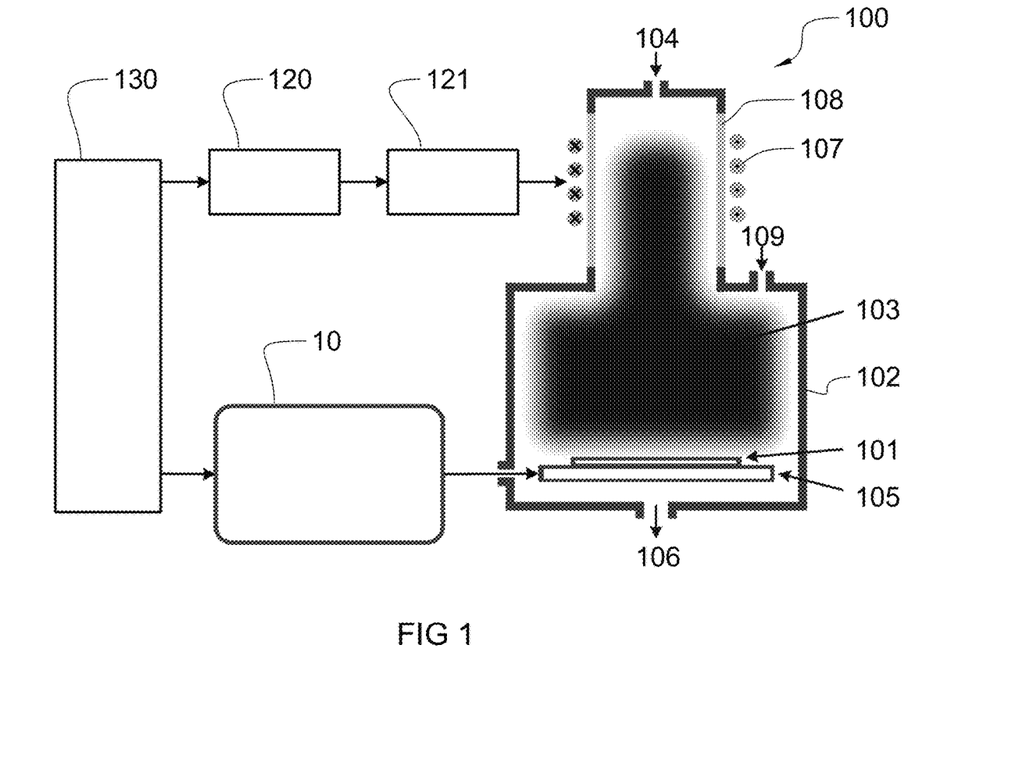
FIG. 1 represents an example of a voltage waveform generator used as bias generator for an ICP (Inductively Coupled Plasma) reactor according to aspects of the present disclosure.

FIG. 1 shows one of the typical usages of a bias voltage waveform generator (BVG) 10 in an Inductively Coupled Plasma (ICP) apparatus 100, where the BVG 10 is controlling the substrate 101 (typically a wafer) voltage by controlling the substrate stage voltage. In a plasma reactor 102, a plasma 103 is generated by introduction of a plasma forming gas 104 in a dielectric tube 108 surrounded by an induction coil 107. The arrangement forms a plasma torch which directs the plasma 103 towards a platform 105 (substrate stage) on which the substrate 101 is positioned. Optionally, a precursor 109 can be introduced in the plasma reactor 102. A RF voltage is applied to the induction coil 107 through a RF power supply 120, and a matching network 121 as known in the art. The RF power supply 120, as well as the BVG 10 can be controlled through a system host controller 130. Plasma processes suitable for the present disclosure are so called low or reduced pressure plasma, i.e. operating at a pressure significantly below atmospheric pressure, e.g. between 1 mTorr and 10 Torr. To this end, the plasma reactor 102 is advantageously airtight and the desired pressure in plasma reactor 102 is obtained through a vacuum pump 106.

The BVG 10 can also be used in other configurations like a Capacitively Coupled Plasma (CCP) reactor, or with a direct inter connection (not via the system host) of control signals between a source power generator (RF power supply) and BVG. A different source can be used to generate the plasma (e.g. Capacitively Coupled Plasma, Electron Cyclotron Resonance, Magnetron, DC voltage, etc.).

Figure 2:
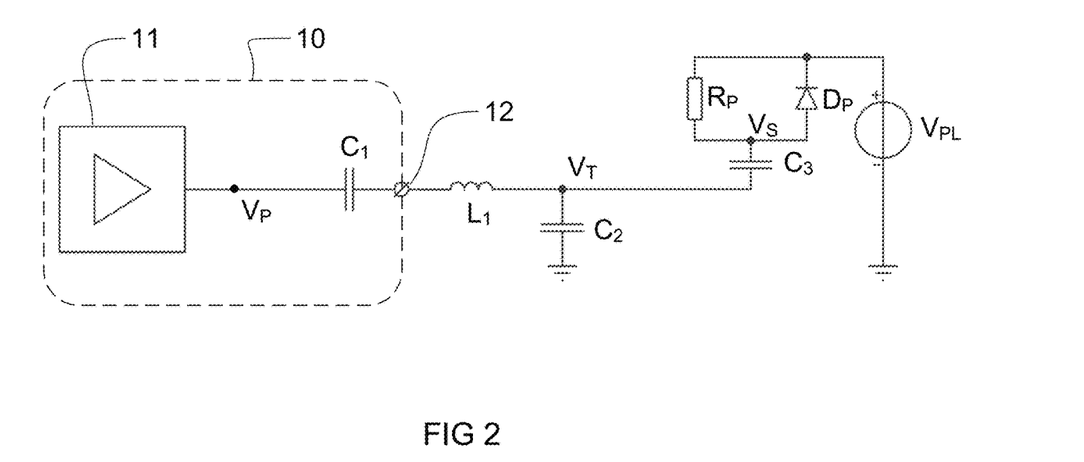
FIG. 2 represents a simplified reactor plasma model and the voltage waveform generator according to the present disclosure coupled to it.

FIG. 2 represents a (highly) simplified electrical model of a plasma reactor, showing the load posed by the reactor and the plasma on the BVG 10 so as to explain the operation of the BVG 10. BVG 10 comprises a power stage 11 which is coupled to the output terminal 12 of the BVG 10 through an optional physical capacitor $C_1$ to prevent DC current from the voltage induced on the surface of the substrate 101, or from the voltage of an electronic chuck from flowing through the power stage 11. The power stage 11 is configured to generate a bias voltage which is applied at output terminal 12. The DC component of this bias voltage is self-biasing due to $C_1$, e.g. the voltage is set due to the difference in ion and electron mobility in the sheath. The plasma reactor can be modeled as shown in FIG. 2, although more or less complex models can be used as well. $L_1$ is a lumped inductance representing the inductance caused by the BVG output power interconnection and return path. $C_2$ is a lumped capacitance representing the capacitance from the substrate stage 105 and substrate stage power interconnection to earth. This capacitance is usually dominated by the capacitance from the substrate table to the dark shield, i.e. a metal shield adjacent the platform 105 preventing the plasma to propagate beyond the platform, e.g. into pump 106. $C_3$ is the combined capacitance of the dielectric substrate and/or substage stage of dielectric material (e.g. due to the electrostatic chuck holder on/in the substrate stage). $R_P$ Represents the sheath impedance, caused by the limited ion mobility in the sheath, during the process period. $D_P$ Represents the high electron mobility in the sheath, during the discharge period. $V_{PL}$ is the plasma potential at the sheath above the substrate.

Figure 3:
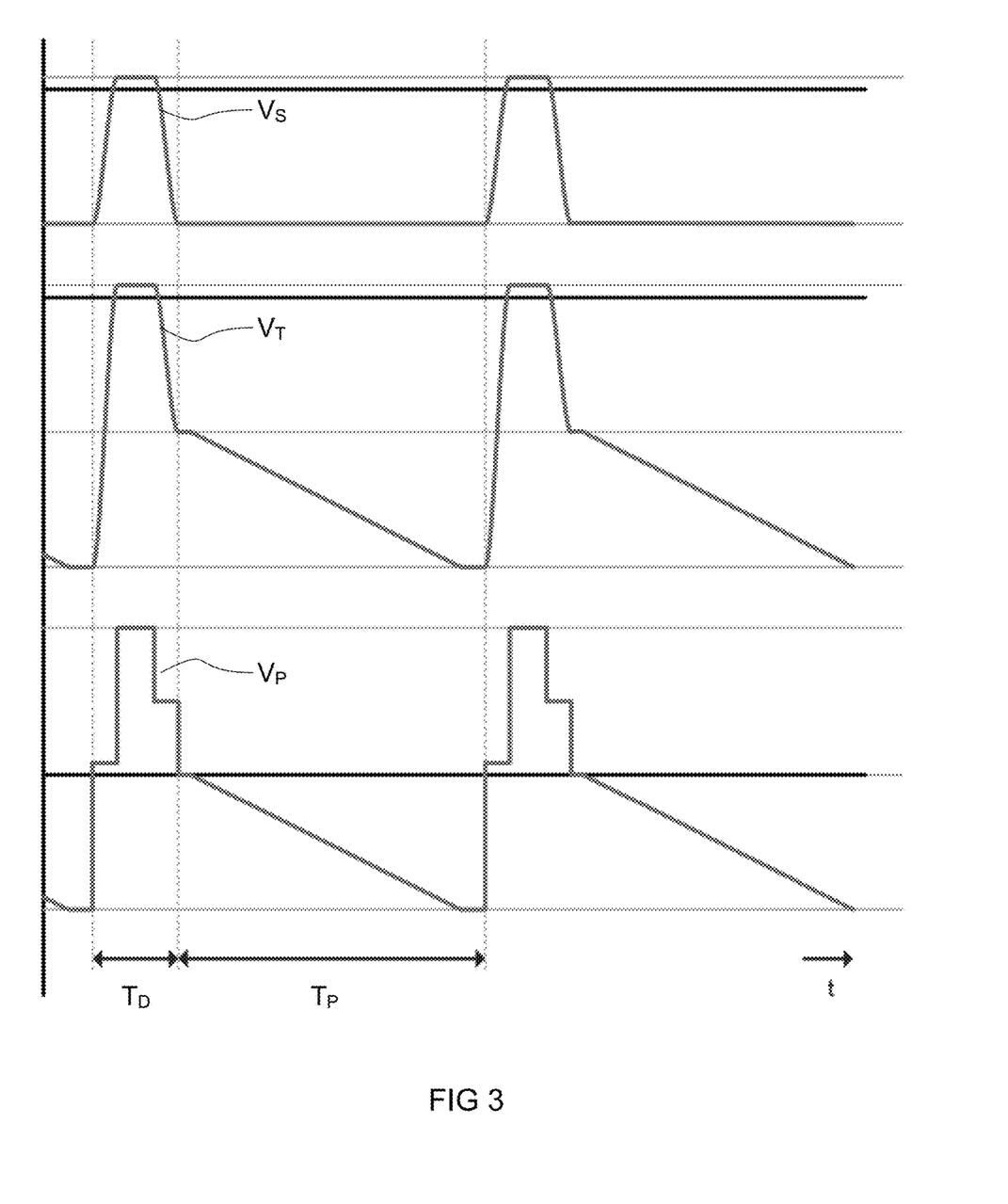
FIG. 3 represents (periodic) voltage waveforms (not drawn to scale) that can be applied to the nodes indicated in FIG. 2.

A DC (bias) voltage over the sheath ideally results in a narrow IED, with the level of the DC voltage controlling the level of the (average) ion energy. There is a charge build up on dielectric substrates and/or substage stages of dielectric material (e.g. electrostatic chuck holders) caused by the positively charged ions that are collected on the surface. This charge build up on the substrate and/or substrate stage needs to be compensated for to keep the voltage potential over the sheath (and therefore the ion energy) constant. The charge build up and therefore the potential over the substrate and/or substrate stage needs to be limited to prevent damage of the substrate and/or substrate stage. This compensation can be achieved by a periodic discharge of the substrate and/or substrate stage during a discharge period $T_D$ between consecutive process periods $T_P$ as shown in FIG. 3. FIG. 3 shows an ideal periodic voltage waveform $V_P$ to be generated by the BVG, so as to obtain an ideal voltage waveform $V_S$ on the exposed surface of the substrate. The nodes $V_P$, $V_T$, $V_S$ in which the waveforms are evaluated are shown in FIG. 2, where $V_P$ represents the voltage output by the power stage 11, $V_T$ the voltage at the substrate stage (table) 105, and $V_S$ the substrate voltage, i.e. the voltage on the exposed surface of the substrate 101. Typical values for the discharge period $T_D$ can be on the order of 500 ns. Typical values for the processing period $T_P$ can be on the order of 10 μs.

Figure 4:
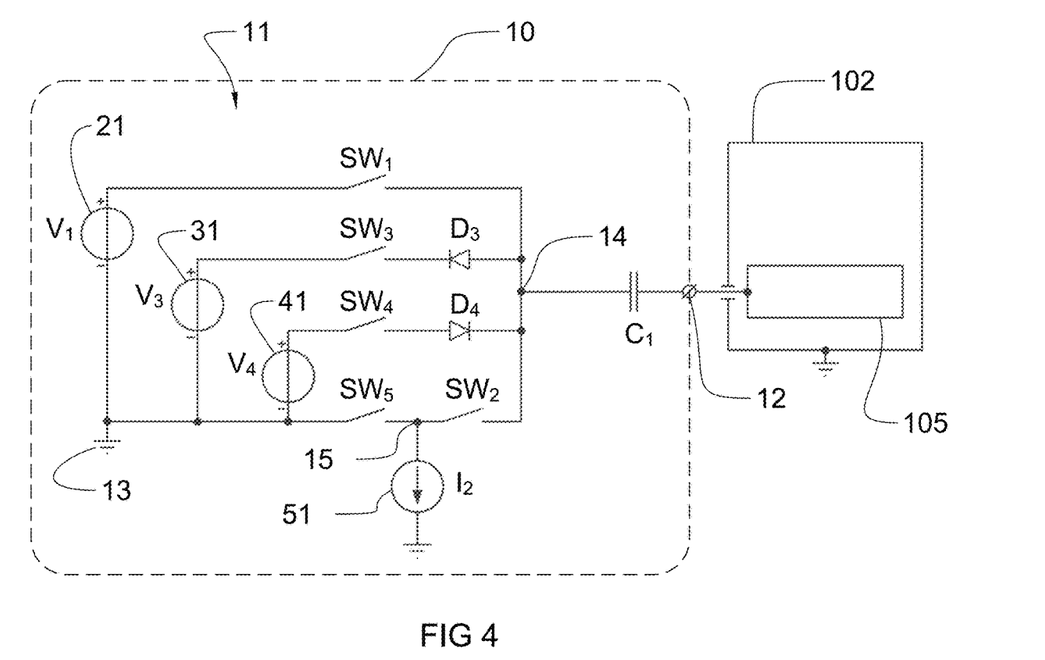
FIG. 4 represents a voltage waveform generator according to a first embodiment of the present disclosure.

According to the present disclosure, the drawbacks of the prior art relating to excessive commutation losses and uncontrolled resonance ringing are remedied by implementing a particular commutation in the power stage 11 of the BVG 10, referred to as resonant commutation. Referring to FIG. 4, to make resonant commutation possible, the power stage 11 comprises a first DC power supply, implemented as a voltage source 21 configured to output a DC voltage of a first magnitude $V_1$. DC voltage source 21 is connected to an output node 14 of the power stage 11 through a first switch $SW_1$. The power stage 11 further comprises a second DC power supply, implemented as a current source 51 configured to output a DC current of a second magnitude $I_2$, and a ground terminal 13 providing earth potential. In the present embodiment, DC current source 51 is connected to output node 14 through a second switch $SW_2$. The ground terminal 13 is connected to an intermediate node 15 between the current source 51 and the second switch $SW_2$ through a bypass switch $SW_5$.

Closing both switches $SW_2$ and $SW_5$ connects ground terminal 13 to the output node 14. The output node is connected to the output terminal 12 of the BVG 10, which in turn can be coupled to the substrate stage 105. DC blocking capacitor $C_1$ can optionally be coupled between the output node 14 and the output terminal 12.

In addition, power stage 11 comprises a third DC power supply, and a fourth DC power supply, both being implemented as voltage sources 31, 41 respectively and configured to output DC voltages of a third magnitude $V_3$ and a fourth magnitude $V_4$, respectively. DC voltage source 31 and 41 are connected to the output node 14 through respective third and fourth switches $SW_3$, $SW_4$. The interconnection lines between voltage sources 31 and 41 and output node 14 can advantageously comprise diodes $D_3$ and $D_4$ respectively to allow current in one direction only. All the voltage sources 21-41 are parallel connected to output node 14.

Figure 5:
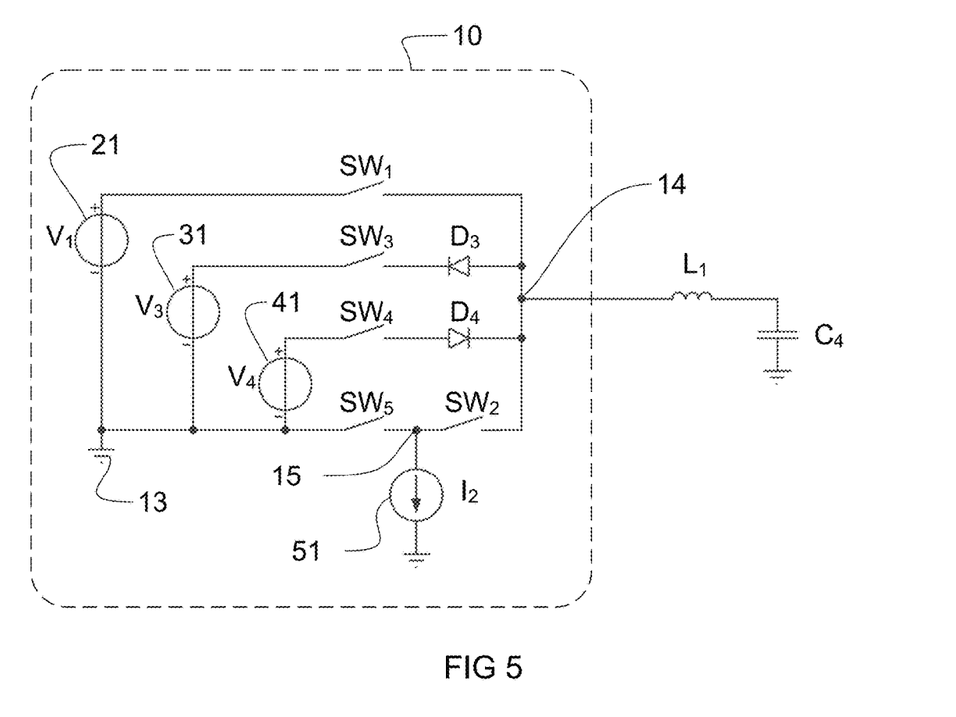
FIG. 5 represents the voltage waveform generator of FIG. 4, with a simplified model of the load coupled to the power stage of the voltage waveform generator.
Figure 6:
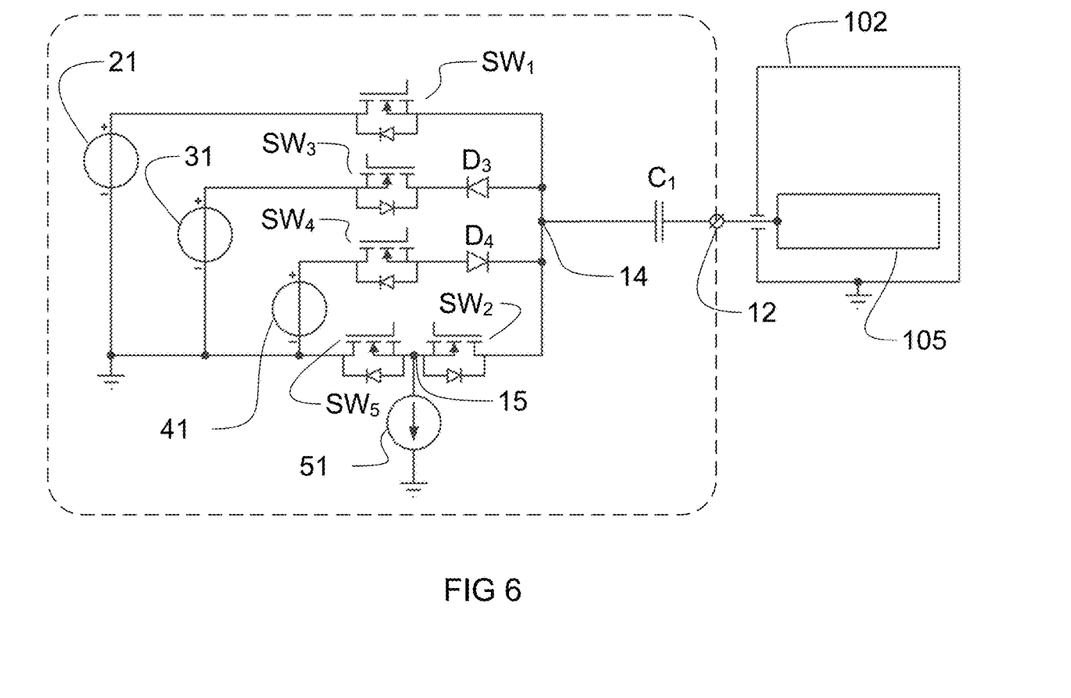
FIG. 6 represents a possible switch implementation of the voltage waveform generator of FIG. 4, with N-channel MOSFETs.

A simplified model of the load as seen by the output node 14 is shown in FIG. 5. FIG. 6 shows a possible implementation of switches $SW_1$ through $SW_5$ using N-channel MOSFETs.

Figure 7:
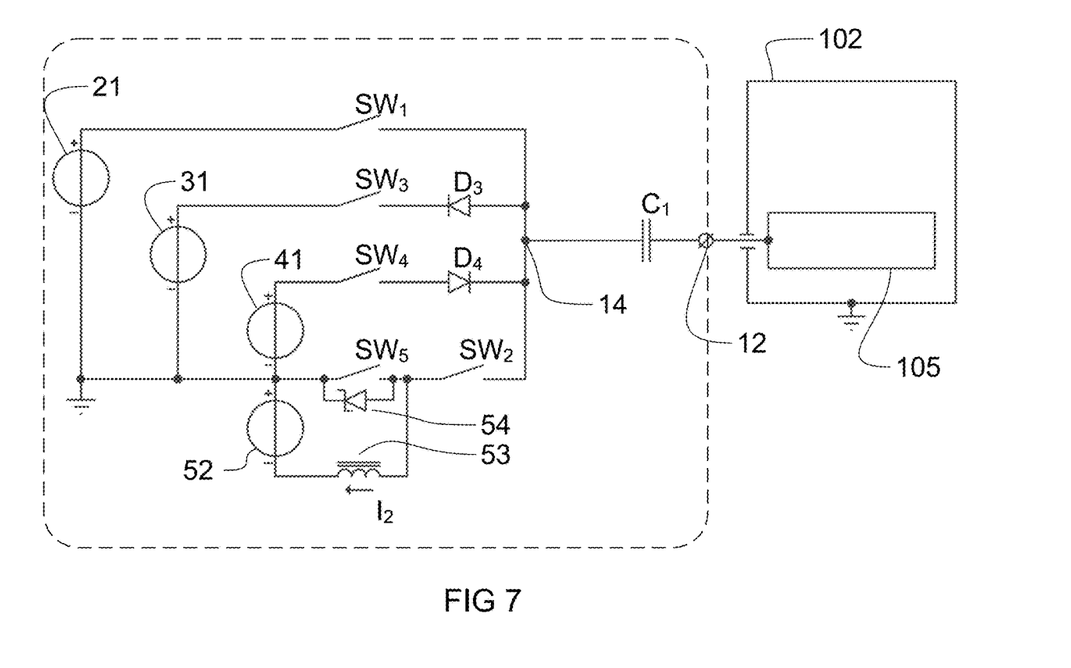
FIG. 7 represents the voltage waveform generator of FIG. 4, in which the DC current source has been implemented with a DC voltage source and coupled inductor, and optionally a transient voltage suppressor (TVS)

Referring to FIG. 7, the DC current source 51 can alternatively be implemented using a DC voltage source 52 in series with an inductor 53 typically having a large inductance, e.g. 0.5 mH or more. A transient voltage suppressor 54 is advantageously placed over $SW_5$ to provide a continuous current path for inductor 53, and to limit the voltage over $SW_5$. Other alternative implementations use a power amplifier generating a variable DC current, e.g. for compensation of dielectric constant change due to voltage biasing. Likewise, alternative implementations of voltage sources 21, 31 and 41 are possible, e.g. based on a current source with capacitor connected between current source output and ground. It is alternatively possible to connect the low voltage side of voltage source 41 (connected to ground in FIG. 7) to the low voltage side of voltage source 52. This allows to use only voltage sources providing positive voltages.

Figure 8:
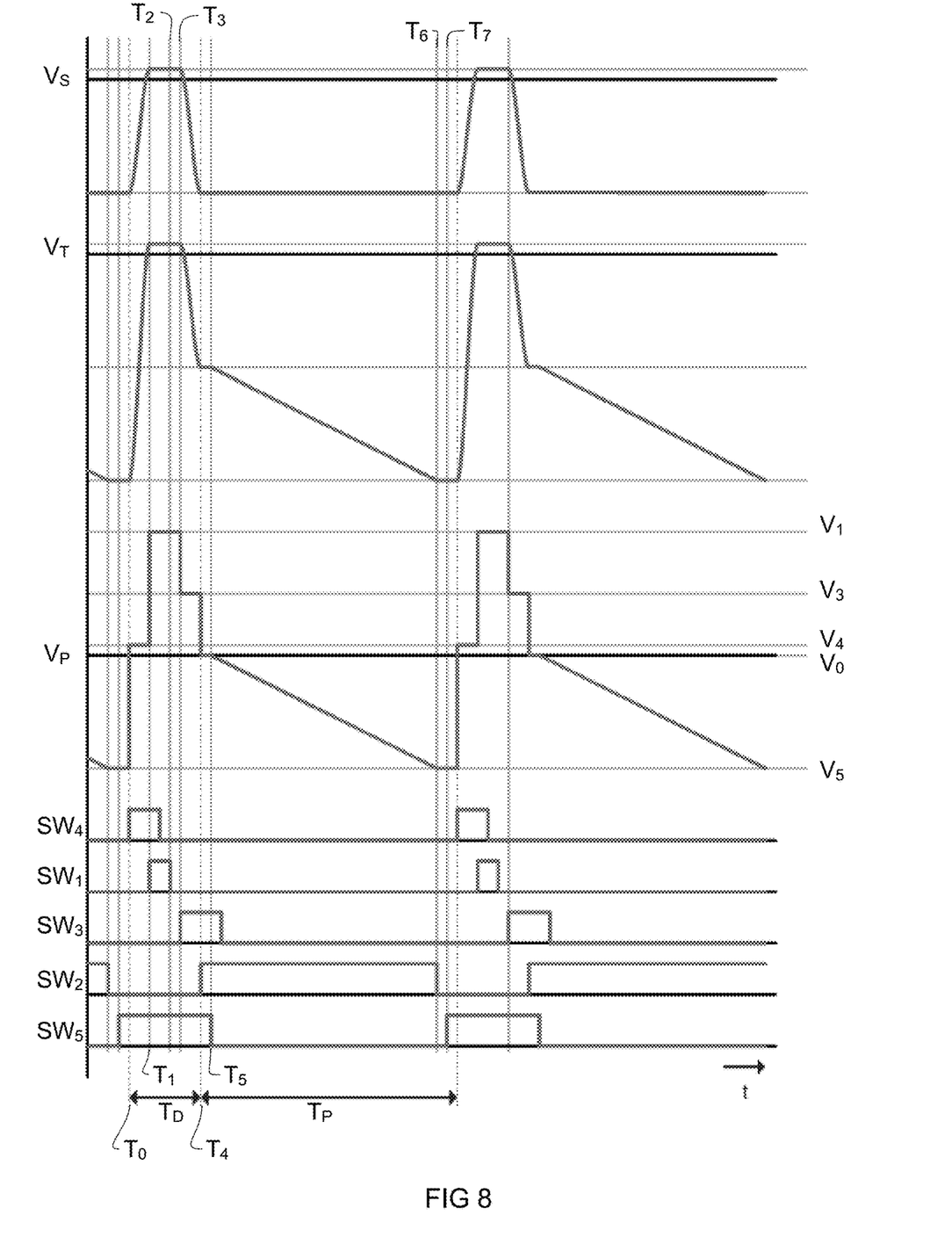
FIG. 8 represents a graph showing the relation between the power stage voltage levels and the switch control signals for the voltage waveform generator of FIG. 4.

According to the present disclosure, the additional DC voltage sources 31 and 41 allow for reducing or eliminating commutation losses and resonance ringing during or after commutation when obtaining a desired bias voltage waveform. Referring to FIG. 8, the switches $SW_1$ through $SW_5$ can be operated using control signals following the sequence shown. To obtain the desired periodic voltage waveform $V_S$ at the substrate 101, the BVG 10 will need to output a voltage waveform $V_P$ at the output node 14, depending on the modeled load (see e.g. FIG. 2). $V_P$ can comprise a positive voltage peak to obtain a substrate discharge, followed by a voltage drop and ramp down during a processing time of the substrate.

Advantageously, the waveform $V_P$ can include at least three distinct voltage levels: a first positive voltage of magnitude $V_1$, which is advantageously supplied by voltage source 21, a second negative voltage of magnitude $V_5$, obtained by ramping down the voltage when connecting current source 51 to the load, and ground potential $V_0$. The voltage waveform generator 10 according to the present disclosure advantageously allows for obtaining such waveform by using the additional voltage sources 31 and 41 to provide for intermediate voltage levels $V_3$ and $V_4$ in the waveform $V_P$ for effecting the voltage rise towards $V_1$ on the one hand, and the voltage drop to ground potential $V_0$, or even to $V_5$, on the other. These additional (intermediate) voltage levels, allow for avoiding undesired voltage oscillation following a commutation event by using an appropriate switching timing between the different voltage levels.

By way of example, and still referring to FIG. 8, starting at time $T_0$, a substrate discharge period $T_D$ is started in which the substrate voltage $V_S$ is brought to a positive value. To this end, switch $SW_4$ is closed at $T_0$, while the other switches $SW_1$, $SW_2$ and $SW_3$ remain open, except for the bypass switch $SW_5$ which may be closed as well to provide for a current path for current $I_2$. Closing $SW_4$ causes $V_P$ to rise to the magnitude $V_4$ of voltage source 41. Next, at $T_1$, $SW_1$ is closed causing $V_P$ to rise to level $V_1$. $SW_4$ is advantageously opened somewhat after $T_1$, since $V_4$ is lower than $V_1$ and due to the presence of diode $D_4$. The magnitude $V_1$ is advantageously selected to make the substrate voltage $V_S$ positive.

To start a new processing period $T_P$ following the substrate discharge period $T_D$, $V_S$ is made negative again. To do so, switch $SW_1$ and advantageously also $SW_4$ are opened, e.g. at time $T_2$, and somewhat later, at $T_3$, switch $SW_3$ is closed causing the voltage $V_P$ to fall to the magnitude $V_3$ of voltage source 31, until switch $SW_2$ is closed at time $T_4$ connecting the output node to ground potential (causing a (further) drop of $V_P$) since switch $SW_5$ remains closed until a later time $T_5$. This marks the beginning of the processing period $T_P$. The magnitudes $V_3$, $V_4$ and $V_1$ are advantageously maintained constant during closure of the respective switches, and the magnitude may be continuously constant throughout operation.

At $T_5$, $SW_5$ is opened while $SW_2$ is kept closed. This causes the output node 14 to be connected to the current source 51 and current $I_2$ will effect a voltage ramp down of $V_P$ advantageously allowing to maintain the substrate voltage $V_S$ at a constant level, by compensating for the charge build up on the substrate and/or substrate stage. Just prior to starting a new discharge period, bypass switch $SW_5$ is closed at time $T_7$, advantageously somewhat after opening switch $SW_2$ at time $T_6$.

Switch $SW_3$ can be opened at some time past $T_4$ and possibly even past $T_5$ due to diode $D_3$. Note that there is advantageously no dead time required between $SW_4$ and $SW_1$ (due to diode $D_4$) and between $SW_3$ and $SW_2$ (due to diode $D_3$). The dead time $T_3$-$T_2$ is required to prevent short circuiting of $V_1$ and $V_3$.

The power stage 11 as described herein allows to be operated (by generating appropriate switching control signals for switches $SW_1$-$SW_5$) in such a way to minimize the oscillations on the output and to prevent parasitic resonance in the system. To this end, the power stage is advantageously operated such that the current through $L_1$ is brought to 0 A at the end of a commutation period. In the waveform of FIG. 8, there are basically two commutation periods. A first commutation is during a voltage rise phase, in particular starting at $T_0$, i.e. the closure of $SW_4$, and ending at $T_1$, i.e. the closure of $SW_1$. A second commutation is during a voltage drop phase. This commutation period starts at $T_3$, i.e. the closure of $SW_3$ and ends at $T_4$, i.e. the closure of $SW_2$.

Figure 11:
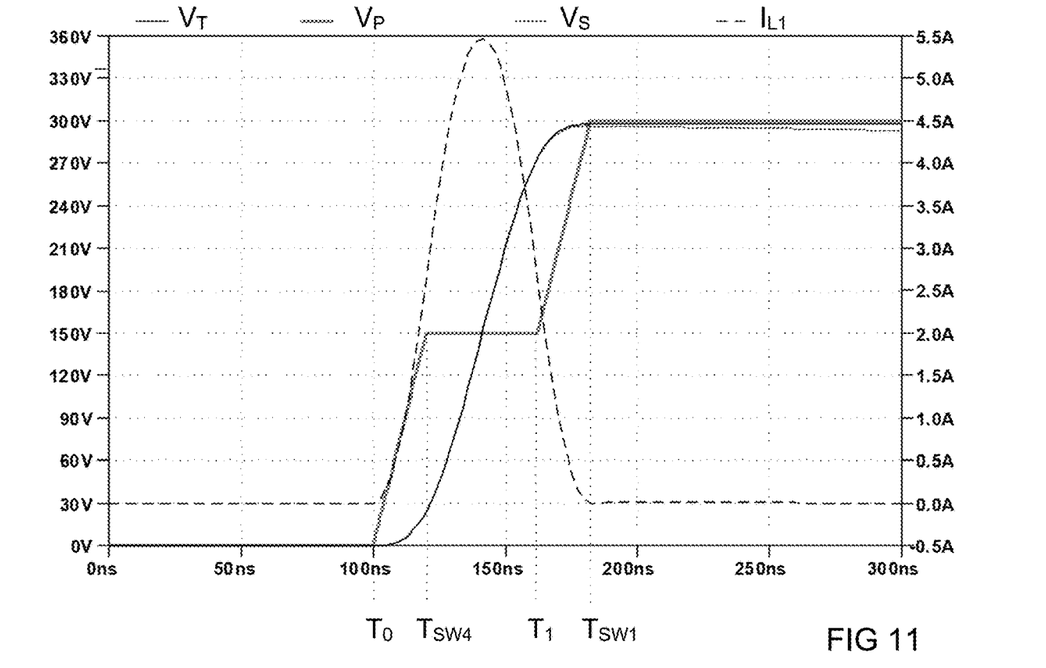
FIG. 11 represents a graph showing voltage and current levels during a commutation according to aspects of the present disclosure with switch slew-rate.
Figure 12:
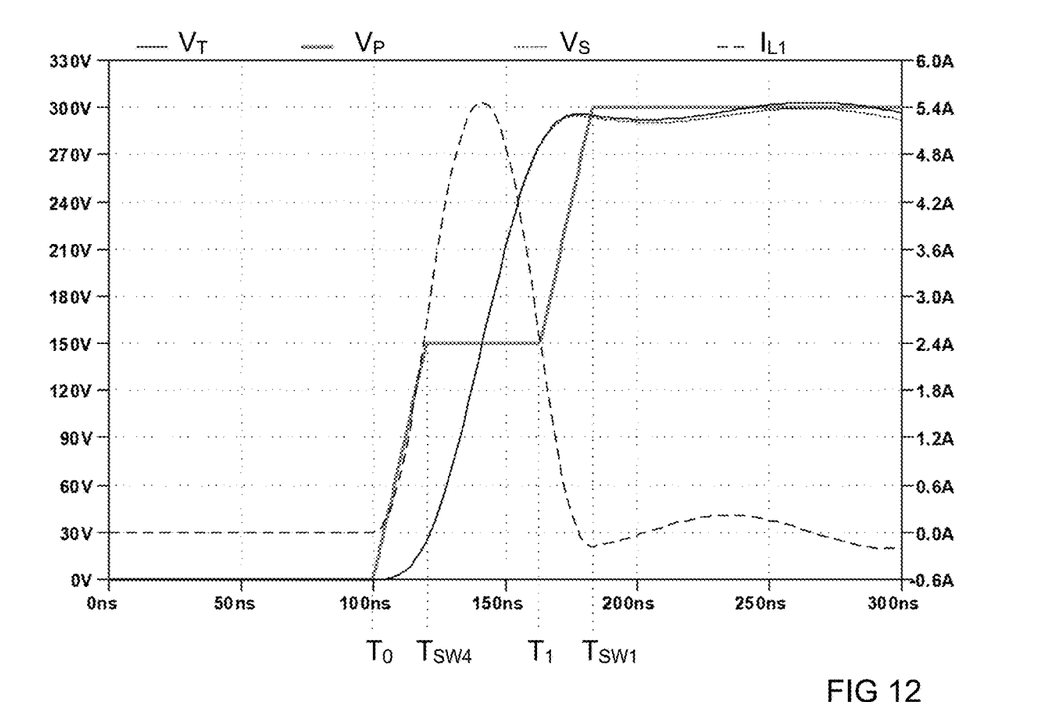
FIG. 12 represents a graph showing voltage and current levels during a non-optimal commutation with switch slew-rate.

To ensure that the current through $L_1$ can be brought to 0 A at end of a commutation period, in particular at $T_4$, and advantageously also at $T_1$, the instants $T_1$ and $T_4$ in which the switches $SW_1$ respectively $SW_2$ are closed (or equivalently the switching intervals $T_1$-$T_0$ and $T_4$-$T_3$), are advantageously appropriately selected. If the switch ($SW_1$ or $SW_2$) closes too late, an oscillation between $L_1$ and the voltage $V_P$ on the output node 14 is induced due to a capacitance on the output node 14 and the fact that the voltage on this capacitance is not equal to the voltage on $C_4$. If the switch ($SW_1$ or $SW_2$) closes too early the current through $L_1$ is not 0 A and this will cause a ringing between $L_1$ and $C_4$. The criticality of selecting the appropriate switching time is shown in FIGS. 11 and 12. In FIGS. 11 and 12, $T_0$ and $T_1$ represent the instants at which control signals are applied to switches $SW_4$ and $SW_1$ to close the respective switch. In practice, the switches will have a finite switching speed which is shown in FIGS. 11 and 12 by a finite dV/dt on the voltage $V_P$ at the output node 14. As a result, the switch $SW_4$ will start closing at $T_0$ and the closed state will be achieved at instant $T_{SW4}$. Similarly, switch $SW_1$ starts closing at $T_1$ and the closed state will be achieved at instant $T_{SW1}$.

As can be seen from FIG. 11, the closed state of switch $SW_1$ is achieved at an instant $T_{SW1}$ at which the current $I_{L1}$ through $L_1$ has fallen to zero, and oscillation of the voltage at the substrate stage $V_T$ or at the substrate $V_S$ is prevented. This is not the case in FIG. 12, where the closed state of $SW_1$ ($T_{SW1}$) is achieved at an instant in which $I_{L1}$ is not zero at $T_{SW1}$.

In addition to the above, oscillation is advantageously prevented by appropriate selection of the voltage level applied during a commutation period ($V_3$ respectively $V_4$). The voltage level advantageously falls between the voltage level at commutation start (instants $T_0$ and $T_3$ respectively) and the voltage level at commutation end (instants $T_1$ and $T_4$ respectively). It can be shown that an optimal voltage level of $V_3$ and $V_4$ equals ($V_{END\ COMMUTATION}$+$V_{START\ COMMUTATION}$)/2. In other words, an optimal magnitude of $V_3$ is the average of $V_P$ at $T_0$ and $T_1$. An optimal magnitude of $V_4$ is the average of $V_P$ at $T_3$ and $T_4$.

When the load of the BVG 10 as seen at output node 14 can be modeled as a series LC circuit with reactor inductance $L_1$ and total capacitance $C_4$ as shown in FIG. 5, the optimal commutation time $T_{COMMUTATION}$ equaling $T_1$-$T_0$ and $T_4$-$T_3$ respectively can be set as $T_{COMMUTATION}$=$\pi$ $\sqrt{L_1 C_4}$ where $C_4$ represents the equivalent capacitance as seen from output node 14, e.g. the total of $C_1$, $C_2$ and $C_3$ in the model of FIG. 2. More generally, it can be stated that the optimal commutation time $T_{COMMUTATION}$ assuming ideal conditions corresponds to half the period corresponding to the fundamental natural frequency $f_0$ (resonant frequency) of the load, or $T_{COMMUTATION}$=$0.5/f_0$.

Figure 9:
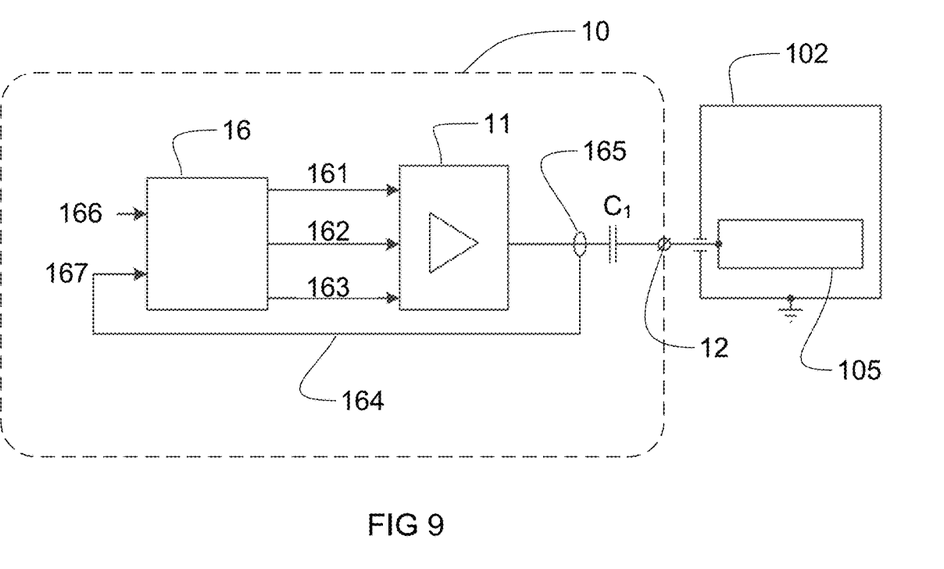
FIG. 9 represents schematically a closed loop control implementation of the voltage waveform generator of FIG. 4.

In the above it is assumed that all components, e.g. switches, diodes, and the lumped model of the plasma reactor are ideal and lossless. Since this will not correspond to a real situation, the commutation parameters can be further adapted to take non-ideal situations into account. One may start operation based on the values for the commutation parameters (commutation time, commutation voltage) as determined above. During operation, one or more of these commutation parameters are advantageously adapted by implementing an appropriate process control, e.g. through a closed loop control algorithm, e.g. based on current feedback. Referring to FIG. 9, the BVG 10 comprises a controller 16 configured to control operation of the power stage 11. In particular, controller 16 is configured to output switch control signals 161 to control operation of switches $SW_1$ through $SW_5$. Controller 16 can be configured to output voltage setpoints 162 to set the magnitude of one or more of DC voltage sources 21, 31, 41 and possibly 52. Controller 16 can further be configured to output a current setpoint 163 to set the level of DC current $I_2$ output by current source 51. Alternatively, one or more of the DC voltage sources 21, 31, 41 and 52, and/or current source 51 can have a voltage or current output of fixed magnitude.

Controller 16 advantageously comprises a feedback control loop, advantageously a current feedback control loop 164. Current control loop 164 comprises a current sensor 165 configured to measure the current output by the power stage 11. Current sensor 165 can be arranged at output node 14. Controller 16 can comprise a first input 167 coupled to current control loop 164, which is configured to feed the value of the output current measured by current sensor 165 to the controller 16. Through a second input 166, controller 16 can be configured to receive setpoints for one or more of the switch control signals 161, the voltage setpoints 162 and the current setpoint 163. These setpoints can be received from a system host controller or user interface, which may be configured to determine the setpoints based on a model of the load of the BVG 10, e.g. as determined in the previous paragraphs. Controller 16 may be configured to adjust the setpoints, in particular switch control signals 161 and/or voltage setpoints 162, based on the input 167 fed back from the current sensor 165.

Figure 10:
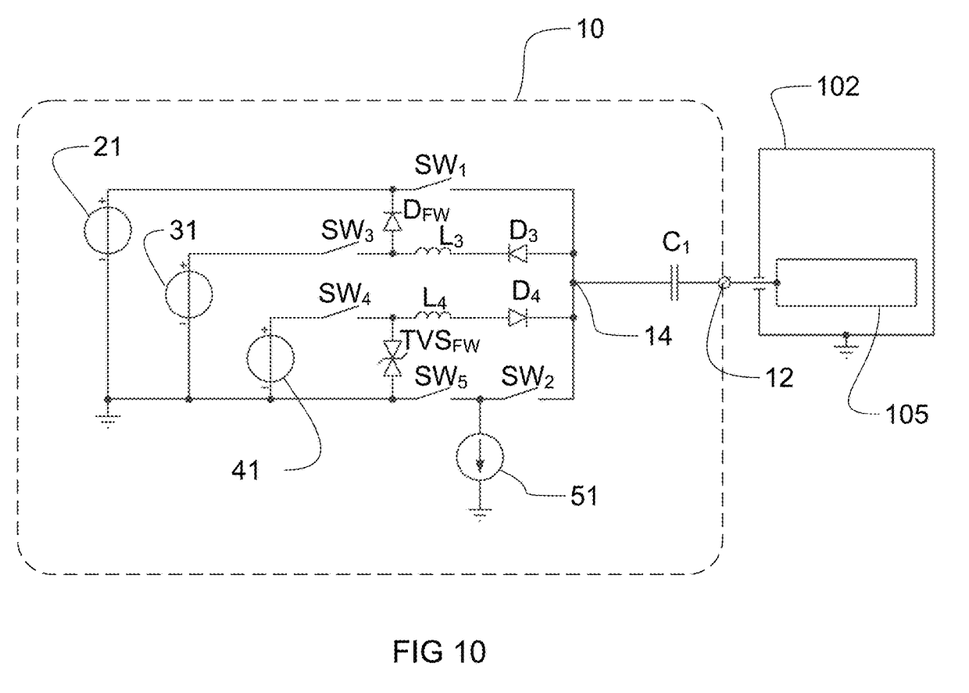
FIG. 10 represents the voltage waveform generator of FIG. 4 with added commutation inductances.

Referring to FIG. 10, to improve control of the commutation period and make the commutation less sensitive to the closing moment of $SW_1$ or $SW_2$ in case of reactors with a high self-resonance frequency (e.g. low $C_4$ and/or low $L_1$), commutation inductors $L_3$ and $L_4$ can be added in series with commutation switches $SW_3$ and $SW_4$. Alternatively, or in addition, an inductor can be added series with the output blocking capacitor $C_1$ (not shown).

The diagram of FIG. 10 additionally comprises an overvoltage protection circuit, implemented through diode DFW and a bidirectional transient voltage suppressor $TVS_{FW}$ allowing to protect an overvoltage between $SW_4$ and $L_4$.

Figure 13:
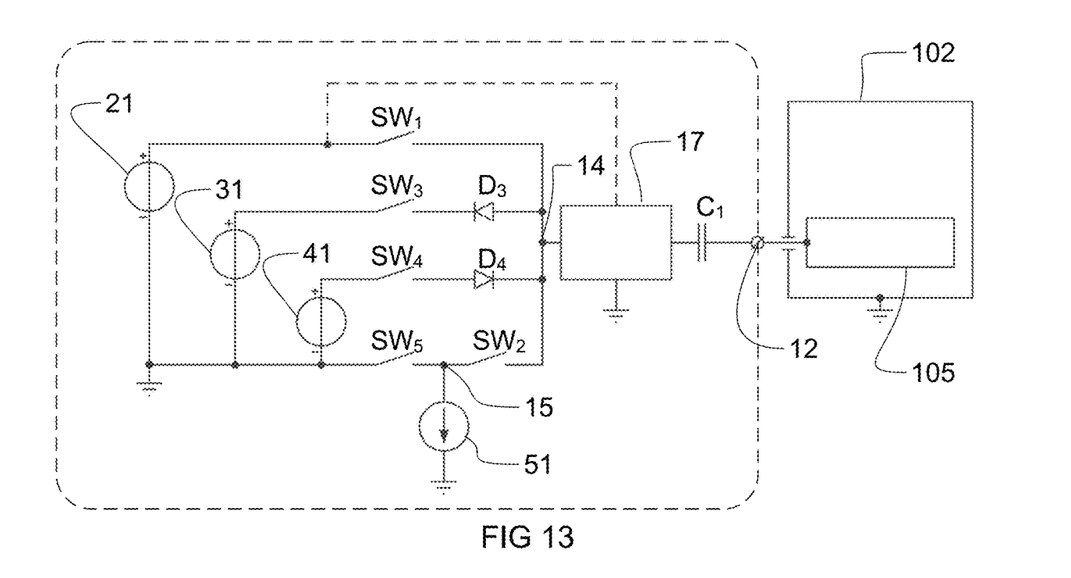
FIG. 13 represents a voltage waveform generator as in FIG. 4 including an overvoltage protection circuit.
Figure 14:
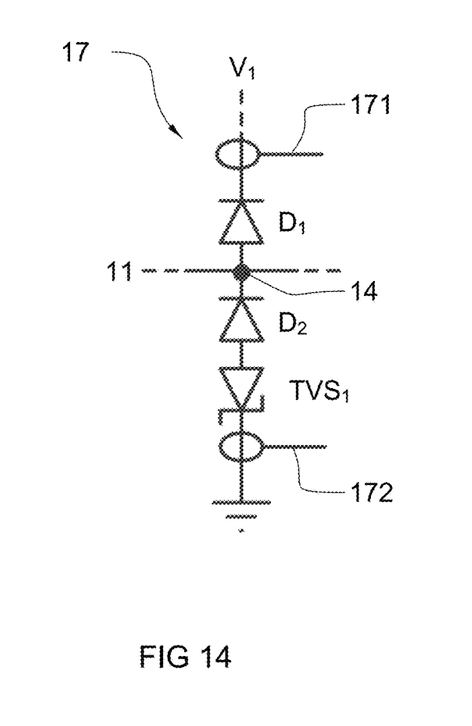
FIG. 14 represents a first implementation example of the overvoltage protection circuit of FIG. 13.
Figure 15:
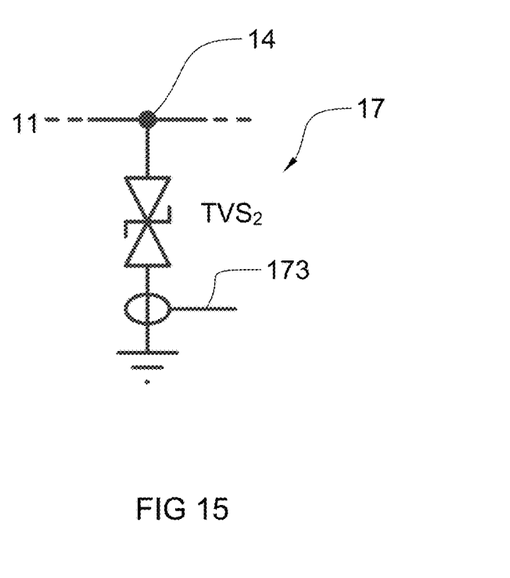
FIG. 15 represents a second implementation example of the overvoltage protection circuit of FIG. 13.

Referring to FIG. 13, an overvoltage protection circuit 17 can be provided at the output of the power stage 11 or BVG 10 and configured to protect the power stage 11 by clamping the output voltage. Possible implementations of the overvoltage protection circuit are shown in FIGS. 14 and 15. The overvoltage protection circuit can comprise a diode $D_1$ between output node 14 and the voltage source 21. Between output node 14 and earth potential, a diode $D_2$ and unidirectional transient voltage suppressor $TVS_1$ are coupled in opposite current direction. When a current through the clamping diodes and/or TVS is detected by current measurement sensors 171, 172 or 173, the power stage 11 can be turned off to reduce losses.

Figure 16:
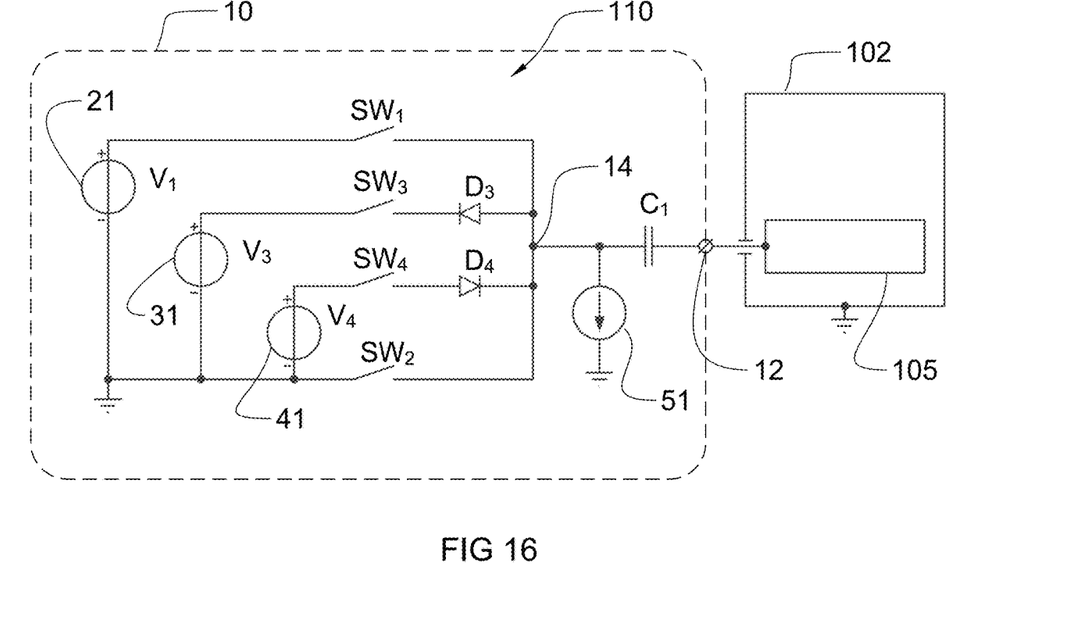
FIG. 16 represents a voltage waveform generator according to a second embodiment of the present disclosure, with a continuous current source.
Figure 17:
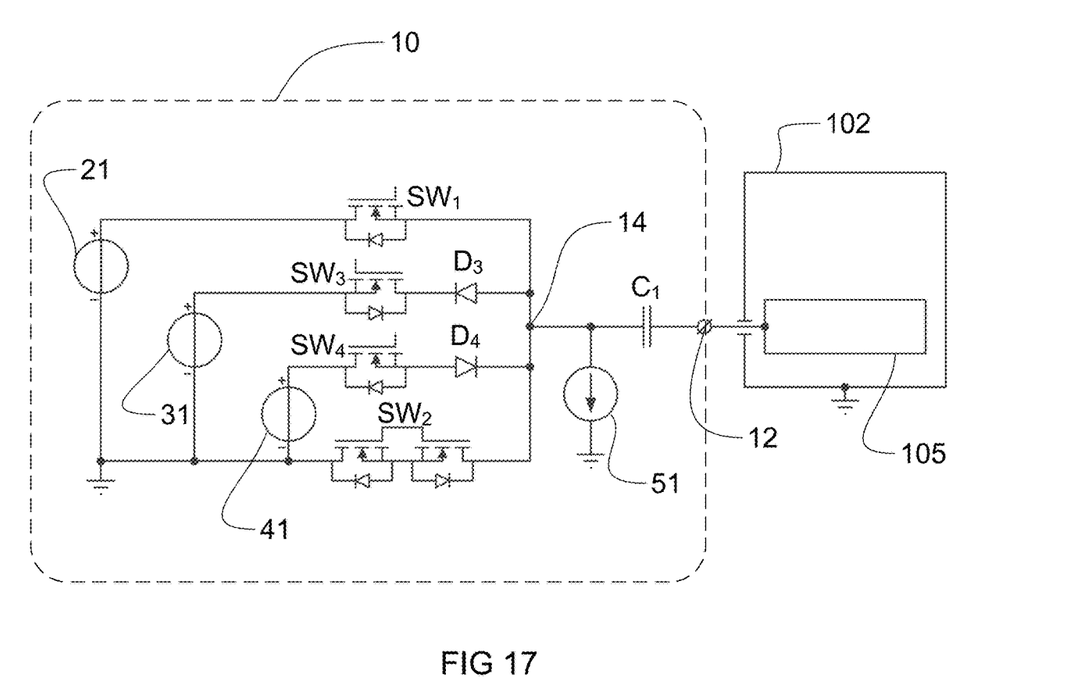
FIG. 17 represents a possible switch implementation of the voltage waveform generator of FIG. 16, with N-channel MOSFETs.

Referring to FIGS. 16 and 17, in an alternative embodiment of power stage 110 for the BVG 10, current source 51 is coupled between the output node 14 and the output terminal 12, advantageously between output node 14 and output blocking capacitor $C_1$. This allows to have a continuous compensation current $I_2$, although the voltage across current source 51 will be higher than for power stage 11. In power stage 110, the bypass switch $SW_5$ can be omitted, even though switch $SW_2$ should have bidirectional voltage blocking and current conduction capability.

The invention claimed is:

1. A method of generating a voltage waveform at an output, the method comprising:
 providing a first DC voltage having a first magnitude ($V_1$), a second DC current (I) having a second magnitude, a third DC voltage having a third magnitude ($V_3$), and a fourth DC voltage having a fourth magnitude ($V_4$), wherein the first ($V_1$) magnitude is higher than the third ($V_3$) and the fourth ($V_4$) magnitude,
 coupling the fourth DC voltage to the output followed by coupling the first DC voltage to the output, to bring an output voltage ($V_p$) at the output to a high level,
 decoupling the first DC voltage from the output, followed by coupling the third DC voltage to the output, to obtain a drop of the output voltage ($V_p$),
 coupling a ground potential ($V_0$) to the output following coupling the third DC voltage, and
 coupling the second DC current ($I_2$) to the output following coupling the ground potential, wherein the second DC current ramps down the output voltage ($V_p$).

2. The method of claim 1, wherein the first ($V_1$), third ($V_3$) and fourth ($V_4$) magnitudes are constant during coupling of the respective DC voltage to the output.

3. The method of claim 1, wherein one or both of: the third magnitude ($V_3$) and the fourth magnitude ($V_4$) are higher than the ground potential ($V_0$).

4. The method of claim 1, wherein the third magnitude ($V_3$) and the fourth magnitude ($V_4$) are different.

5. The method of to claim 1, further comprising coupling the output to a processing platform supporting a substrate which is plasma processed, wherein the voltage waveform causes a positive voltage peak followed by a negative voltage at an exposed surface of the substrate.

6. The method of claim 5, further comprising one or a combination of: selecting a commutation time ($T_{COMMUTATION}$) between the step of coupling the fourth DC voltage and the step of coupling the first DC voltage and selecting a commutation time between the step of coupling the third DC voltage and the step of coupling the ground potential ($V_0$) to obtain a zero current between the output and the processing platform at an instant ($T_{SW1}$) of coupling the first DC voltage and an instant of coupling the ground potential ($V_0$) respectively.

7. The method of claim 5, further comprising one or a combination of: selecting a commutation time ($T_{COMMUTATION}$) between the step of coupling the fourth DC voltage and the step of coupling the first DC voltage and selecting a commutation time between the step of coupling the third DC voltage and the step of coupling the ground potential ($V_0$),
 wherein the commutation time is representative of $0.5/f_0$, wherein $f_0$ is a natural frequency of an electrical system of a plasma processing system as seen by the output.

8. The method of any claim 5, further comprising measuring a current between the output and the processing platform, and adapting one or more of:
 a commutation time ($T_{COMMUTATION}$) between the step of coupling the fourth DC voltage and the step of coupling the first DC voltage,
 a commutation time between the step of coupling the third DC voltage and the step of coupling the ground potential ($V_0$),
 the third magnitude ($V_3$), and
 the fourth magnitude ($V_4$).

9. The method of claim 1, comprising one or a combination of:
 selecting the fourth magnitude ($V_4$) to be representative of an average of:
 the output voltage ($V_p$) at an instant ($T_0$) of coupling the fourth DC voltage to the output and
 the output voltage ($V_p$) at an instant ($T_1$) of coupling the first DC voltage to the output, and
 selecting the third magnitude ($V_3$) to be representative of an average of:
 the output voltage ($V_p$) at an instant ($T_3$) of coupling the third DC voltage to the output and
 the output voltage ($V_p$) at an instant ($T_4$) of coupling the ground potential ($V_0$) to the output.

10. The method of claim 1, comprising one or a combination of: uncoupling the fourth DC voltage following the coupling of the first DC voltage and uncoupling the third DC voltage following the coupling of the second DC current.

11. A voltage waveform generator for a plasma processing apparatus, the voltage waveform generator comprising a power stage and a controller, wherein the power stage comprises:
 an output node,
 a first DC power supply coupled to the output node through a first switch ($SW_1$), wherein the first DC power supply is configured to output a voltage of a first magnitude ($V_1$),
 a second DC power supply coupled to the output node and configured to provide a current ($I_2$) of second magnitude, and
 a ground terminal coupled to the output node through a second switch ($SW_2$, $SW_5$),
 wherein the power stage further comprises:
 a third DC power supply coupled to the output node through a third switch ($SW_3$), wherein the third DC power supply is configured to output a voltage of a third magnitude ($V_3$), and
 a fourth DC power supply coupled to the output node through a fourth switch ($SW_4$), wherein the fourth DC power supply is configured to output a voltage of a fourth magnitude ($V_4$),
 wherein the first, third and fourth DC power supplies are coupled in parallel to the output node,
 wherein the first magnitude ($V_1$) is larger than the third magnitude ($V_3$) and the fourth magnitude ($V_4$),
 wherein the controller is configured to control actuation of the first ($SW_1$), second ($SW_2$, $SW_5$), third ($SW_3$) and fourth ($SW_4$) switches to obtain a predetermined voltage waveform at the output node.

12. The voltage waveform generator of claim 11, wherein the controller is configured to consecutively close the fourth switch ($SW_4$), the first switch ($SW_1$), the third switch ($SW_3$), and the second switch ($SW_2$, $SW_5$) in that order, to obtain a voltage pulse at the output node.

13. The voltage waveform generator of claim 12, wherein the controller is configured to open the first switch ($SW_1$) prior to closing the third switch ($SW_3$).

14. The voltage waveform generator of any claim 11, wherein the second DC power supply is configured to draw the current ($I_2$) having a positive second magnitude from the output node.

15. The voltage waveform generator of any claim 11, wherein the second DC power supply is coupled to the output node through a fifth switch ($SW_2$, $SW_5$), the controller being configured to operate the fifth switch.

16. The voltage waveform generator of claim 15, wherein the controller is configured to close the fifth switch following closing of the second switch.

17. The voltage waveform generator of claim 15, comprising a bypass switch ($SW_5$) and a process switch ($SW_2$) connected in series between the ground terminal and the output node, wherein the second DC power source is coupled to a node between the bypass switch and the process switch, wherein the controller is configured to operate the bypass switch and the process switch such that when the bypass switch ($SW_5$) is closed, the process switch ($SW_2$) forms the second switch, and when the bypass switch ($SW_5$) is open, the process switch ($SW_2$) forms the fifth switch.

18. The voltage waveform generator of any claim 11, comprising a current control loop coupled to the controller, wherein the current control loop comprises a current measurement sensor operable to measure a current at output node, and wherein the controller is configured to adjust one or more of:
a switching time of one or more of the first ($SW_1$), second ($SW_2$, $SW_5$), third ($SW_3$) and fourth ($SW_4$) switches, and
a setpoint of one or more of the third ($V_3$) and fourth ($V_4$) magnitudes, on the basis of a value determined by current measurement sensor.

19. The voltage waveform generator of any claim 11, comprising one or a combination of: a commutation inductor ($L_3$, $L_4$) coupled between the third switch ($SW_3$) and the output node and a commutation inductor coupled between the fourth switch ($SW_4$) and the output node.

20. An apparatus for plasma processing, comprising:
an arrangement for configured to generate a plasma;
a processing platform for configured to support a substrate to be processed by the plasma; and
the voltage waveform generator of claim 11, wherein the output node is electrically connected to the processing platform.

* * * * *

UNITED STATES PATENT AND TRADEMARK OFFICE
CERTIFICATE OF CORRECTION

PATENT NO. : 11,875,972 B2
APPLICATION NO. : 17/604897
DATED : January 16, 2024
INVENTOR(S) : Antonius Wilhelmus Hendricus Johannes Driessen It is certified that error appears in the above-identified patent and that said Letters Patent is hereby corrected as shown below:

In the Claims

Column 9, Line 25, the text "a second DC current (I)" should read --a second DC current ($I_2$)--.
Column 9, Line 49, the text "The method of to claim 1" should read --The method of claim 1--.
Column 10, Line 7, the text "The method of any claim 5" should read --The method of claim 5--.
Column 11, Line 9, the text "The voltage waveform generator of any claim 11" should read --The voltage waveform generator of claim 11--.
Column 11, Line 13, the text "The voltage waveform generator of any claim 11" should read --The voltage waveform generator of claim 11--.
Column 12, Line 3, the text "The voltage waveform generator of any claim 11" should read --The voltage waveform generator of claim 11--.
Column 12, Line 15, the text "The voltage waveform generator of any claim 11" should read --The voltage waveform generator of claim 11--.
Column 12, Line 21, the text "an arrangement for configured to" should read --an arrangement configured to--.
Column 12, Line 22, the text "a processing platform for configured to" should read --a processing platform configured to--.

Signed and Sealed this
Twenty-seventh Day of February, 2024

Katherine Kelly Vidal
*Director of the United States Patent and Trademark Office*